(12) United States Patent
Wang

(10) Patent No.: US 10,468,325 B2
(45) Date of Patent: Nov. 5, 2019

(54) RFIC DEVICE AND METHOD OF FABRICATING SAME

(71) Applicant: SHANGHAI JADIC OPTOELECTRONICS TECHNOLOGY CO., LTD., Shanghai (CN)

(72) Inventor: Xiaochuan Wang, Shanghai (CN)

(73) Assignee: SHANGHAI JADIC OPTOELECTRONICS TECHNOLOGY CO., LTD., Pudong New Area Shanghai (CN)

( * ) Notice: Subject to any disclaimer, the term of this patent is extended or adjusted under 35 U.S.C. 154(b) by 0 days.

(21) Appl. No.: 15/949,295

(22) Filed: Apr. 10, 2018

(65) Prior Publication Data

US 2018/0331009 A1 Nov. 15, 2018

(30) Foreign Application Priority Data

May 9, 2017 (CN) .......................... 2017 1 0322564

(51) Int. Cl.
*H01L 23/367* (2006.01)
*H01L 27/12* (2006.01)
*H01L 21/48* (2006.01)
*H01L 21/84* (2006.01)
(Continued)

(52) U.S. Cl.
CPC ...... *H01L 23/3672* (2013.01); *H01L 21/4882* (2013.01); *H01L 21/84* (2013.01); *H01L 23/66* (2013.01); *H01L 27/1203* (2013.01); *H01L 23/367* (2013.01); *H01L 23/3731* (2013.01); *H01L 23/3732* (2013.01); *H01L 2224/0401* (2013.01); *H01L 2224/04042* (2013.01); *H01L 2224/131* (2013.01); *H01L 2924/1421* (2013.01)

(58) Field of Classification Search
CPC .. H01L 23/3672; H01L 21/4882; H01L 21/84
See application file for complete search history.

(56) References Cited

U.S. PATENT DOCUMENTS

| | | | |
|---|---|---|---|
| 2002/0022328 A1* | 2/2002 | Ang ........................ | H01L 21/84 438/303 |
| 2010/0314712 A1* | 12/2010 | Arai ........................ | H01L 21/84 257/517 |

(Continued)

*Primary Examiner* — Errol V Fernandes
(74) *Attorney, Agent, or Firm* — Muncy, Geissler, Olds & Lowe, P.C.

(57) ABSTRACT

A radio frequency integrated circuit (RFIC) device and methods for fabricating same are disclosed. The RFIC device includes: a first semiconductor layer having a first surface, a second surface parallel to the first surface and a thickness of smaller than 3 μm; a first dielectric layer on the first surface of the first semiconductor layer; a semiconductor component within the first semiconductor layer and the first dielectric layer; a second dielectric layer on the second surface of the first semiconductor layer, the second dielectric layer having a thickness of smaller than 1 μm; and a sheet-like heat sink formed on a surface of the first dielectric layer opposite to the first semiconductor layer for dissipating heat from the semiconductor component. Efficient dissipation of heat from an RF transistor to a certain extent can be achieved by the RFIC device.

20 Claims, 2 Drawing Sheets

(51) Int. Cl.
H01L 23/66 (2006.01)
H01L 23/373 (2006.01)

(56) References Cited

U.S. PATENT DOCUMENTS

2015/0325559 A1* 11/2015 Niu .................. H01L 21/76802
 257/675
2017/0324015 A1* 11/2017 Mandal .................. H01L 35/10
2018/0174948 A1* 6/2018 Butt ...................... H01L 23/481

* cited by examiner

RFIC DEVICE AND METHOD OF FABRICATING SAME

CROSS-REFERENCES TO RELATED APPLICATIONS

This application claims the priority of Chinese patent application number 201710322564.0, filed on May 9, 2017, the entire contents of which are incorporated herein by reference.

TECHNICAL FIELD

The present invention relates to the field of semiconductor technology and, in particular, to a radio frequency integrated circuit (RFIC) device and methods of fabricating the device.

BACKGROUND

Silicon-on-insulator (SOI) substrates have overwhelming advantages over bulk silicon. It provides IC components formed thereon with good dielectric isolation which immunizes them from parasitic latching that complementary metal oxide semiconductor (CMOS) circuits formed on bulk silicon suffer from. In addition, ICs fabricated on SOI substrates offer the advantages including small parasitic capacitance, a high integration density, a high operating speed, simple fabrication processes, small short channel effects and high suitability for use as low-voltage low-power consumption circuits. Thanks to their inherent advantage of high insulation, CMOS devices on SOI substrates are ideal for use as key components and circuits at RF front-ends, including RF switches, low SNR power amplifiers, modulators and their circuits.

Compared to those on bulk silicon substrates, CMOS RF switches on SOI substrates are remarkably superior in terms of insertion loss and isolation. However, as many CMOS RF components formed on the top silicon thin-film such as RF CMOS switches and CMOS low noise amplifiers (LNAs) are still in electrical coupling with the silicon substrate underlying the insulating layer, during the operation of such components, in particular RF CMOS switches, additional variable parasitic capacitance will occurs which can dramatically affect the linearity of a passed signal. Additionally, a rather large part of the passed signal will be consumed in the silicon substrate due to the coupling.

Theoretically, an ultimate measure to eliminate such coupling between the RF CMOS devices on the top silicon thin-film and the silicon substrate is to remove the silicon substrate during the fabrication of the RF CMOS switches, which, however, may lead to a number of adverse consequences, in particular, lower heat dissipation capabilities of the RF CMOS switches. As a result, upon the application of high signal power in a short period of time, overheating may occur and the reliability of the components may be impaired.

SUMMARY OF THE INVENTION

It is an objective of the present invention to propose a novel RF switch and IC device and methods of fabricating them to overcome the overheating-caused low reliability problem.

In one aspect of the present invention, there is provided a novel radio frequency integrated circuit (RFIC) device including:
  a first semiconductor layer having a first surface, a second surface and a thickness of smaller than 3 µm;
  a first dielectric layer on the first surface of the first semiconductor layer;
  a semiconductor component within the first semiconductor layer and the first dielectric layer;
  a second dielectric layer on the second surface of the first semiconductor layer, the second dielectric layer having a thickness of smaller than 1 µm; and
  a sheet-like heat sink that is formed on a surface of the second dielectric layer opposite to the first semiconductor layer for dissipating heat from the semiconductor component.

First of all, it is worthy to mention that the semiconductor component includes at least one first transistor and that the first semiconductor layer has a thickness of smaller than 3 µm while the second dielectric layer has a thickness of smaller than 1 µm. It is stressed here that the first semiconductor layer for the formation of crucial active components of the RFIC device represented by the first transistor has a thickness of smaller than 3 µm (or even 0.2 µm particularly when the RFIC device is to be deployed in an RF front-end) and vertically isolated by the first and second dielectric layers at its upper and lower sides because this, on the one hand, is intended to reduce or even prevent, in the vertical direction, external electrical or electromagnetic interference by virtue of the two dielectric layers, and on the other hand, can minimize parasitic effects for transistors formed on the semiconductor layer.

In addition, construction of an efficient heat-dissipating component external to the first dielectric layer is considered to be an effective way to dissipate heat generated by the first transistor in the first semiconductor layer from the top of the transistor. In order to avoid this from introducing any additional electrical induction or parasitic effect to the transistor, the heat-dissipating component is preferably implemented as a heat sink made of a dielectric material with a high thermal conductivity. If the thermal conductivity is close to that of silicon, then heat dissipation capabilities that are substantially the same as provided by the removed silicon substrate or close thereto can be attained.

Further, in order to facilitate dissipation of heat through the top of the first transistor in the vertical direction, it is necessary to properly select the thickness (usually smaller than 1 µm) and material of the second dielectric layer.

Therefore, the dielectric material of the first heat sink sheet may be selected as, for example, boron nitride having a certain crystalline phase and a thermal conductivity of up to 200 W/m·K.

Similarly, in order for heat generated by the first transistor to be efficiently dissipated through its top, the RFIC device may further include a second heat sink sheet formed on the first dielectric. The second heat sink sheet may be connected to the first heat sink sheet and is preferably located out of the vertical projection area of the first transistor. The second heat sink sheet may be formed of a metal with an even higher thermal conductivity, including but not limited to aluminum, copper, titanium, cobalt, nickel, molybdenum, tin, lead, cadmium, silver, gold, platinum or an alloy thereof.

In another aspect, the present invention provides a method for fabricating the novel RFIC device as defined above. The method includes:
  providing a first compound semiconductor substrate including a first semiconductor layer, a second dielectric layer on a second surface of the first semiconductor layer and a substrate layer on a surface of the second dielectric layer opposite to the first semiconductor layer;

fabricating a semiconductor component based on the first semiconductor layer; forming a first dielectric layer covering the semiconductor component; and forming a sheet-like heat sink on a surface of the first dielectric layer opposite to the first semiconductor layer for dissipating heat from the semiconductor component.

Compared with the prior art: according to the present invention, construction of efficient heat-dissipating components respectively external to the first and second dielectric layer is considered to be an effective way to dissipate heat generated by the first transistor in the first semiconductor layer from the top of the transistor. In order to avoid this from introducing any additional electrical induction or parasitic effect to the transistor, the heat-dissipating components are preferably implemented as heat sinks each made of a dielectric material with a high thermal conductivity. If the thermal conductivity is close to that of silicon, then heat dissipation capabilities that are substantially the same as provided by the removed silicon substrate or close thereto can be attained.

Additionally, in order to facilitate dissipation of heat from the first transistor, it is necessary to properly select the thickness (usually smaller than 1 µm) and material of the second dielectric layer.

DETAILED DESCRIPTION OF EXEMPLARY EMBODIMENTS

Figure 1:
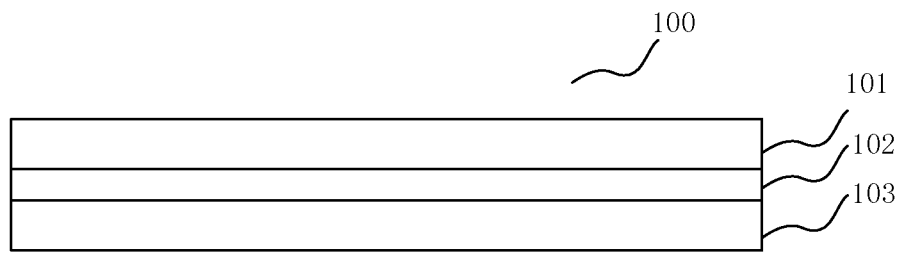
FIGS. 1 to 4 schematically illustrate a method of fabricating an RFIC device in accordance with an embodiment of the present invention.

As noted above, the present invention relates to a radio-frequency integrated circuit (RFIC) device such as an RF switch or another RF component on a silicon-on-insulator (SOI) substrate and methods of fabricating such a device, which will be described below with reference to the accompanying drawings that are not necessarily drawn to scale.

Disclosed below are various embodiments in which various features of the present disclosure are implemented. For the sake of brevity of the present disclosure, particular embodiments of components and arrangements will be described below. It is a matter of course that these embodiments are presented merely by example and are not intended to limit the present invention in any sense. For example, in the following description, "under", "below", "underlying", "overlying" and other spatial terms may be used to facilitate the explanation of relative locations between components shown in the figures. In addition to those shown in the figures, the spatial terms further include other various orientations of the device during its use or operation. The device may be positioned in other orientations, for example, after its rotation by 90 degrees, which will be explained with the spatial terms herein.

Silicon-on-insulator (SOI) substrates often utilize high-resistivity handle substrates (HR-Si handle substrates). Such handle substrates imparts to SOI substrates the ability to meet the requirements of specific applications for, for example, a certain degree of component-to-component isolation or a certain Q-factor of a passive component. In addition, they allow the shrinkage of CMOS components and hence hybrid integration and higher RF performance. All of these make HR-Si handle substrates very attractive to mobile integrated systems.

SOI substrates have overwhelming advantages over bulk silicon. It provides IC components formed thereon with good dielectric isolation which immunizes them from parasitic latching that CMOS circuits formed on bulk silicon suffer from. In addition, ICs fabricated on SOI substrates offer the advantages including small parasitic capacitance, a high integration density, a high operating speed, simple fabrication processes, small short channel effects and high suitability for use as low-voltage low-power consumption circuits. Thanks to their inherent advantage of high insulation, CMOS devices on SOI substrates are ideal for use as key components and circuits at RF front-ends, including RF switches, low SNR power amplifiers, modulators and their circuits.

The RFIC devices described in the following embodiments include RF switches, low SNR power amplifiers, modulators, mobile integrated systems and circuits thereof.

As used herein, the term "radio frequency (RF)" refers to a frequency of electromagnetic waves in the range of 3 Hz to 300 Hz for generation and detection of radio waves. The RF spectrum covers the Very High Frequency (VFH), Ultra High Frequency (UHF), Super High Frequency (SHF) and Extremely High Frequency (EHF) bands. As used herein, the VHF band means the frequencies in the range of 30M Hz to 300M Hz, used for frequency modulation (FM) broadcasting among its other applications; UHF band means the frequencies in the range of 300 MHz to 3 GHz, used for mobile phones, wireless networks and microwave rates among its other applications; SHF band means the frequencies in the range of 3 GHz to 30 GHz, used for wireless networks, radar and satellite links among its other applications; and EHF means the frequencies in the range of 30 GHz to 300 GHz, corresponding to a millimeter wavelength of 1 mm to 10 mm, used for data links and remote sensing among its other applications.

Referring to FIG. 1, a first compound semiconductor substrate 100 is provided. In a method for fabricating a radio-frequency integrated circuit (RFIC) device in accordance with a first explanatory embodiment of the present invention, the first compound semiconductor substrate 100 includes a first semiconductor layer 101, a second dielectric layer 102 in connection with the first semiconductor layer 101, and a substrate layer 103 in connection with the second dielectric layer 102 and in opposition to the first semiconductor layer 101, i.e., not in connection with the first semiconductor layer 101. The first semiconductor layer 101 has a first surface and a second surface parallel to the first surface. The second dielectric layer 102 is attached to the first semiconductor layer 101 via the second surface of the first semiconductor layer 101.

The first semiconductor layer 101 has a thickness smaller than 3 µm, and the second dielectric layer 102 has a thickness smaller than 1 µm. In particular, when the RFIC device is used in an RF front-end, the thickness of the semiconductor layer may even be smaller than 0.2 µm. This, on one hand, is intended to reduce or even prevent, in the vertical direction, external electrical or electromagnetic interference by virtue of the two dielectric layers (i.e. the second dielectric layer 102 and a first dielectric layer to be described later), and on the other hand, can minimize parasitic effects for transistors formed on the semiconductor layer.

The first semiconductor layer 101 may be formed of a semiconductor material such as, for example, silicon, a silicon-containing semiconductor, germanium, a silicon germanium alloy, a silicon-carbon alloy, gallium arsenide, indium arsenide, lead sulfide or another III-V or II-VI compound semiconductor. The first semiconductor layer 101 is used for the formation of semiconductor components which may be 1 to N (N is a natural number) first transistors and other components of the RFIC device.

The second dielectric layer 102 is attached to the first semiconductor layer 101 via the second surface of the first semiconductor layer 101. The second dielectric layer 102 may include at least one dielectric material such as, for example, silicon dioxide, silicon nitride, silicon oxynitride, silicon oxide or any combination thereof and have a thickness smaller than 1 μm, for example, 50-500 nm, typically 100-300 nm.

The substrate layer 103 may be monocrystalline silicon, silicon oxide, silicon nitride or silicate glass and may be adapted to support the first compound semiconductor substrate 100.

Figure 2:
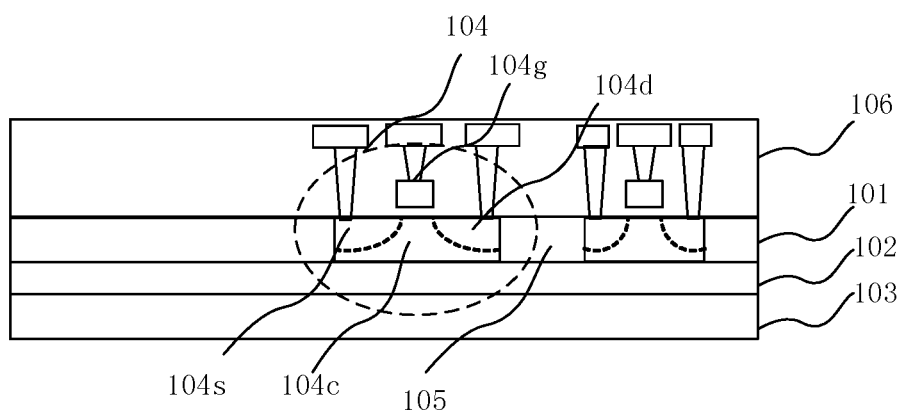

Referring to FIG. 2, a first transistor 104 and a shallow trench isolation (STI) 105 for isolating the first transistor 104 are formed based on the first semiconductor layer 101. Doped regions in the first semiconductor layer 101 respectively serving as a source 104s, a drain 104d and a conductive channel 104c of the first transistor 104 are formed by different doping processes known to those skilled in the art, and description thereof in further detail is therefore deemed unnecessary. Above the channel 104c is formed a gate 104g. In addition to the first transistor 104, a second transistor, a third transistor and other RFIC devices may also be formed in the first semiconductor layer 101.

The portion of the first semiconductor layer 101 surrounded and isolated by the STI 105 is called a first semiconductor sheet, and the first transistor 104 is fabricated within the first semiconductor sheet and covered by a first dielectric layer 106. Preferably, the first semiconductor sheet is formed of silicon or a silicon-containing semiconductor.

The first dielectric layer 106 is formed over the first semiconductor layer 101 by means of vapor deposition and includes at least one dielectric material such as silicon oxide, silicon nitride, silicon oxynitride or a combination thereof. It has a thickness of smaller than 50 μm such as, for example, 10 μm. The first dielectric layer 106 is attached to the first semiconductor layer 101 via the first surface of the first semiconductor layer 101 so that the first dielectric layer 106 covers the first transistor 104.

Figure 3:
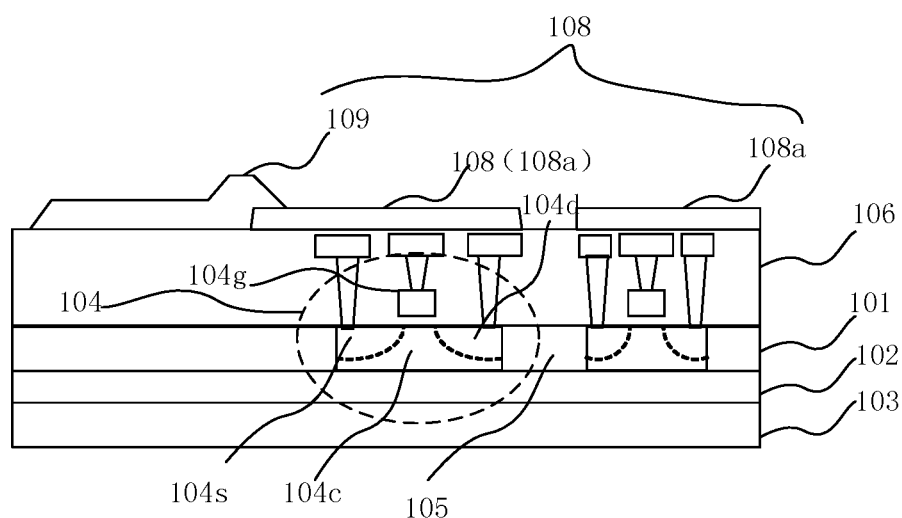

As shown in FIG. 3, a sheet-like heat sink 108 for dissipating heat generated by the semiconductor device is formed on the exposed surface of the first dielectric layer 106, i.e., the surface thereof opposite to the first semiconductor layer 101. Preferably, the sheet-like heat sink 108 includes a first heat sink sheet 108a in a vertical projection area of the first transistor 104, or a vertical projection area of the first heat sink sheet 108a on the first semiconductor layer 101 covers the first transistor 104. When there are more than one first transistor 104, each portion of the first heat sink sheet 108a corresponds to a respective first transistor 104. In this embodiment, since the sheet-like heat sink 108 include only the first heat sink sheet 108a, it itself is the first heat sink sheet 108a, as shown in FIG. 3. The sheet-like heat sink 108 may be a dielectric material with a thermal conductivity five times higher than that of the first dielectric layer 106. As a result, with this efficient heat-dissipating component formed external to the first dielectric layer 106, heat generated by the first transistor 104 in the first semiconductor layer 101 can be dissipated through its top. In order to avoid introducing any additional electrical induction or parasitic effect to the transistor, the heat-dissipating component is preferably implemented as a heat sink made of a dielectric material with a high thermal conductivity. If the thermal conductivity is close to that of silicon, then heat dissipation capabilities that are substantially the same as provided by the removed silicon substrate or close thereto can be attained. For reference, silicon has a thermal conductivity of about 140 W/m-K at room temperature, and that of silicon oxide is approximately 0.2-1.4140 W/m-K (that of quartz glass is only 0.7-11.7140 W/m-K). Aluminum nitride or another piezoelectric material with a high thermal conductivity (the thermal conductivity of aluminum nitride is comparable to that of silicon) may be suitably selected and deposited and etched by conventional semiconductor thin-film processes so as to be compatible with CMOS processes.

The sheet-like heat sink 108 may be formed of a nitrogen-containing dielectric, an oxygen-containing dielectric, boron nitride, aluminum, an aluminum-containing compound, copper, a copper-containing compound, aluminum nitride, diamond-like carbon or a combination thereof.

In one embodiment, the sheet-like heat sink 108 includes the first heat sink sheet 108a in the vertical projection area of the first transistor 104. The first heat sink sheet 108a may be formed of a nitrogen- or oxygen-containing dielectric with a thermal conductivity of up to 30 W/m-K. In this embodiment, the first heat sink sheet 108a may be implemented as a thermal conducting layer deposited by chemical vapor deposition (CVD) at a temperature in the range of 0° C. to 450° C., for example, particularly at 200° C., 300° C. or 400° C. The first heat sink sheet 108a may be formed in positional correspondence to the first transistor by etching the thermal conducting layer, for example, by a dry or wet etching process, in which photolithographic alignment is performed on its backside with respect to the side with features for optical alignment taken as a front side.

In another embodiment, the first heat sink sheet 108a is made of aluminum nitride with a thermal conductivity of up to 140-180 W/m-K. In this embodiment, the first heat sink sheet may be fabricated by sputtering.

In another embodiment, the first heat sink sheet 108a is made of, for example, boron nitride having a certain crystalline phase and a thermal conductivity of up to 200 W/m-K.

In another embodiment, the first heat sink sheet 108a is made of diamond-like carbon with a thermal conductivity of 1000 W/m-K.

Further, the sheet-like heat sink 108 may be formed of another metal that is preferred depending on its thermal conductivity to be aluminum (thermal conductivity=237 W/m-K) or copper (thermal conductivity=401 W/m-K).

The first heat sink sheet may also be formed of another structure in the sheet-like heat sink.

In another embodiment, the sheet-like heat sink 108 may further include heat sink sheets corresponding to semiconductor components other than the first transistor so as to effectively dissipate heat from them.

Figure 4:
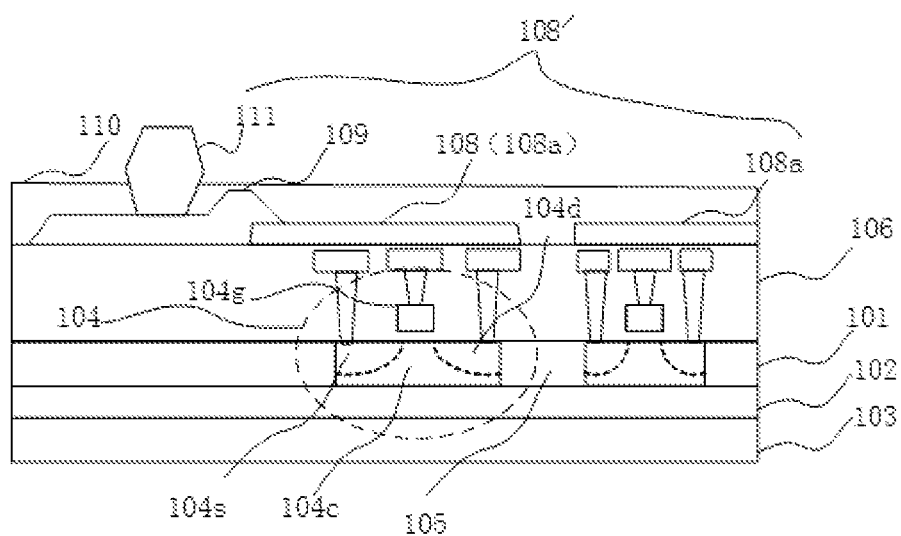

Referring to FIG. 4, in another embodiment, in order to effectively dissipate heat generated by the first transistor 104 through its top, the RFIC device further include a second heat sink sheet 109 on the surface of the first dielectric layer 106 opposite to the first semiconductor layer 101 and in connection with the first heat sink sheet 108a. The second heat sink sheet 109 may be physically connected to the first heat sink sheet 108a. As such, in this embodiment, the sheet-like heat sink 108' includes the first heat sink sheet 108a and the second heat sink sheet 109. The second heat sink sheet 109 is preferably formed of a metal with a higher thermal conductivity, including but not limited to, aluminum, copper, titanium, cobalt, nickel, molybdenum, tin, lead, cadmium, silver, gold, platinum or an alloy thereof, out of the vertical projection area of the first transistor 104.

The second heat sink sheet 109 may be formed by sputtering. Referring to FIG. 4, in another embodiment, the RFIC device further includes a third dielectric layer 110 on the surface of the first dielectric layer 106 opposite to the first semiconductor layer 101. The third dielectric layer 110 may cover the sheet-like heat sink 108' partially or entirely.

Referring to FIG. 4, in another embodiment, the RFIC device further includes a third heat sink sheet 111 on the first dielectric layer 106 (i.e., the surface thereof opposite to the first semiconductor layer 101) and in physical connection with the second heat sink sheet 109. The third heat sink sheet 111 may be, for example, an alloy solder ball or a wire.

The third heat sink sheet 111 may be formed by sputtering.

In another preferred embodiment, the substrate layer is thinned to a minor thickness but not entirely removed.

The present invention also provides a method for fabricating a radio frequency integrated circuit (RFIC) device, the method including:

providing a first compound semiconductor substrate including a first semiconductor layer, a second dielectric layer attached to the first semiconductor layer via a second surface of the first semiconductor layer and a substrate layer attached to the surface of the second dielectric layer opposite to the first semiconductor layer;

fabricating a semiconductor component based on the first semiconductor layer;

forming a first dielectric layer covering the semiconductor component;

providing a second substrate having a first surface on which a sheet-like heat sink is formed; and bonding the first surface of the second substrate to the first dielectric layer of the first compound semiconductor substrate with the first dielectric layer as a bonding layer.

Preferably, the sheet-like heat sink includes a first heat sink sheet and a second heat sink sheet in connection with the first heat sink sheet.

Preferably, the second heat sink sheet is situated out of a vertical projection area of the first transistor.

Accordingly, referring to FIG. 4, the present invention also provides an RFIC device fabricated by the method of the first embodiment of the invention. The RFIC device includes the first semiconductor layer 101, the first dielectric layer 106, the second dielectric layer 102 and the sheet-like heat sink. The first semiconductor layer 101 has a first surface and a second surface parallel to the first surface. The first dielectric layer 106 is attached to the first semiconductor layer 101 via the first surface of the first semiconductor layer 101, and the second dielectric layer 102 is attached to the first semiconductor layer 101 via the second surface of the first semiconductor layer 101. Each of the first dielectric layer 106 and the second dielectric layer 102 includes at least one dielectric material. The first semiconductor layer 101 includes 1 to N first transistors 104 and at least one shallow trench isolation (STI) isolating the first transistors 104. Each first transistor 104 has the doped regions serving as its source 104s, drain 104d and conductive channel 104c formed in the first semiconductor layer 101 and the gate 104g formed in the first dielectric layer 106 in correspondence with the channel 104c. The first heat sink sheet 108a is formed on the exposed surface of the first dielectric layer 106.

The first semiconductor layer 101 includes a semiconductor material such as, for example, silicon, germanium, a silicon germanium alloy, a silicon-carbon alloy, gallium arsenide, indium arsenide, lead sulfide or another III-V or II-VI compound semiconductor. The first semiconductor layer 101 is used for the formation of semiconductor components which may be the first transistors 104 and other components necessary for construction of the RF device, for example, an RF switch.

In this embodiment, a first substrate is further formed on the surface of the second dielectric layer opposite to the first semiconductor layer.

Each of the first dielectric layer 106 and the second dielectric layer 102 includes at least one dielectric material such as, for example, silicon oxide, silicon nitride, silicon oxynitride or a combination thereof and has a thickness between 50 nm and 500 nm, typically between 100 nm and 300 nm.

In one embodiment, the first semiconductor layer 101 has a thickness of smaller than 3 µm, and the second dielectric layer has a thickness of smaller than 1 µM.

In one embodiment, the sheet-like heat sink is formed of a dielectric with a thermal conductivity that is 5 times higher than that of the second dielectric layer.

In one embodiment, the sheet-like heat sink includes the first heat sink sheet 108a located in the vertical projection area of the first transistor.

In one embodiment, the first semiconductor layer includes at least one first semiconductor sheet surrounded and isolated by the STI. The first transistor is formed within the first semiconductor sheet and the first dielectric layer.

In one embodiment, the first semiconductor sheet is formed of silicon or a silicon-containing semiconductor.

In one embodiment, the second dielectric layer 102 is formed of an oxide, a nitride, silicon oxide, silicon nitride or a combination thereof.

In one embodiment, the first heat sink sheet 108a is formed of a nitrogen-containing dielectric, an oxygen-containing dielectric, boron nitride, aluminum, an aluminum-containing compound, copper, a copper-containing compound or a combination thereof.

In one embodiment, the first heat sink sheet 108a is formed of aluminum nitride and/or diamond-like carbon.

In one embodiment, the RFIC device further includes a third dielectric layer 110 on the surface of the first dielectric layer 106 opposite to the first semiconductor layer 101, the third dielectric layer 110 covering the sheet-like heat sink partially or entirely.

In one embodiment, the sheet-like heat sink further includes a second heat sink sheet 109 on the surface of the first dielectric layer 106 opposite to the first semiconductor layer 101 and in connection with the first heat sink sheet 108a.

In one embodiment, the second heat sink sheet 109 is located out of the vertical projection area of the first transistor 104.

In one embodiment, the second heat sink sheet 109 includes a metal thin film including aluminum, copper, titanium, cobalt, nickel, molybdenum, tin, lead, cadmium, silver, gold, platinum or an alloy thereof.

In one embodiment, the second heat sink sheet 109 is formed of a nitrogen-containing dielectric, an oxygen-containing dielectric, boron nitride, aluminum, an aluminum-containing compound, copper, a copper-containing compound, diamond-like carbon or a combination thereof.

In one embodiment, the sheet-like heat sink further includes a third heat sink sheet 111 on the surface of the first dielectric layer 106 opposite to the first semiconductor layer 101 and in connection with the second heat sink sheet 109.

In one embodiment, the third heat sink sheet 111 is an alloy solder ball or a wire.

While the present invention has been described above with reference to several preferred embodiments, the invention is not limited there to in any sense. All changes or modifications made by those skilled in the art based on the above disclosure of the present invention fall within the scope as defined by the appended claims.

What is claimed is:

1. A radio frequency integrated circuit (RFIC) device, comprising:
   a first semiconductor layer having a first surface, a second surface and a thickness of smaller than 3 µm;
   a first dielectric layer on the first surface of the first semiconductor layer;
   a semiconductor component within the first semiconductor layer and the first dielectric layer;
   a second dielectric layer on the second surface of the first semiconductor layer, the second dielectric layer having a thickness of smaller than 1 µm; and
   a sheet-like heat sink formed on a surface of the first dielectric layer opposite to the first semiconductor layer for dissipating heat from the semiconductor component;
   wherein the sheet-like heat sink is formed of a dielectric material to avoid introducing any additional electrical induction or parasitic effect to the semiconductor component.

2. The RFIC device of claim 1, further comprising a first substrate formed on a surface of the second dielectric layer opposite to the first semiconductor layer.

3. The RFIC device of claim 1, wherein the semiconductor component comprises at least one transistor.

4. The RFIC device of claim 1, wherein the dielectric material has a thermal conductivity five times higher than a thermal conductivity of the first dielectric layer.

5. The RFIC device of claim 3, wherein the sheet-like heat sink comprises a first heat sink sheet arranged in a vertical projection area of the at least one transistor.

6. The RFIC device of claim 5, wherein the first heat sink sheet is formed of a nitrogen-containing dielectric, an oxygen-containing dielectric, boron nitride, aluminum, an aluminum-containing compound, copper, a copper-containing compound or a combination thereof.

7. The RFIC device of claim 5, wherein the first heat sink sheet is formed of aluminum nitride and/or diamond-like carbon.

8. The RFIC device of claim 1, further comprising a third dielectric layer formed on the surface of the first dielectric layer opposite to the first semiconductor layer, the third dielectric layer covering the sheet-like heat sink partially or entirely.

9. The RFIC device of claim 5, wherein the sheet-like heat sink further comprises a second heat sink sheet arranged out of the vertical projection area of the at least one transistor and in connection with the first heat sink sheet.

10. The RFIC device of claim 9, wherein the second heat sink sheet is formed of a metal thin film including aluminum, copper, titanium, cobalt, nickel, molybdenum, tin, lead, cadmium, silver, gold, platinum or an alloy thereof.

11. The RFIC device of claim 9, wherein the second heat sink sheet is formed of a nitrogen-containing dielectric, an oxygen-containing dielectric, boron nitride, aluminum, an aluminum-containing compound, copper, a copper-containing compound, diamond-like carbon or a combination thereof.

12. The RFIC device of claim 9, wherein the sheet-like heat sink further comprises a third heat sink sheet in connection with the second heat sink sheet, the third heat sink sheet implemented as an alloy solder ball or a wire.

13. A method of fabricating the radio frequency integrated circuit (RFIC) device as defined in claim 1, comprising:
   providing a first compound semiconductor substrate comprising a first semiconductor layer, a second dielectric layer on a second surface of the first semiconductor layer and a substrate layer on a surface of the second dielectric layer opposite to the first semiconductor layer;
   fabricating a semiconductor component based on the first semiconductor layer;
   forming a first dielectric layer covering the semiconductor component; and
   forming a sheet-like heat sink on a surface of the first dielectric layer opposite to the first semiconductor layer for dissipating heat from the semiconductor component.

14. The method of claim 13, wherein the semiconductor component comprises at least one transistor, and wherein the sheet-like heat sink comprises a first heat sink sheet arranged in a vertical projection area of the at least one transistor.

15. The method of claim 13, further comprising, subsequent to the formation of the sheet-like heat sink: forming, on the surface of the first dielectric layer opposite to the first semiconductor layer, a third dielectric layer covering the sheet-like heat sink partially or entirely.

16. The method of claim 14, further comprising, subsequent to the formation of the first heat sink sheet vertically corresponding to the at least one transistor: forming, on the surface of the first dielectric layer opposite to the first semiconductor layer, a second heat sink sheet connected to the first heat sink sheet and arranged out of the vertical projection area of the at least one transistor.

17. The method of claim 16, further comprising, subsequent to the formation of the second heat sink sheet in connection with the first heat sink sheet: forming, on the surface of the first dielectric layer opposite to the first semiconductor layer, a third heat sink sheet in connection with the second heat sink sheet.

18. A method of fabricating the radio frequency integrated circuit (RFIC) device as defined in claim 1, comprising:
   providing a first compound semiconductor substrate comprising a first semiconductor layer, a second dielectric layer on a second surface of the first semiconductor layer and a substrate layer on a surface of the second dielectric layer opposite to the first semiconductor layer;
   fabricating a semiconductor component based on the first semiconductor layer;
   forming a first dielectric layer covering the semiconductor component;
   providing a second substrate having a first surface with a sheet-like heat sink formed thereon; and
   bonding the first surface of the second substrate to the first dielectric layer of the first compound semiconductor substrate with the first dielectric layer serving as a bonding layer.

19. The method of claim 18, wherein the semiconductor component comprises at least one transistor.

20. The method of claim 19, wherein the sheet-like heat sink comprises a first heat sink sheet arranged in a vertical projection area of the at least one transistor and a second heat sink sheet arranged out of the vertical projection area of the at least one transistor and in connection with the first heat sink sheet.

* * * * *